United States Patent
Washio et al.

(10) Patent No.: US 9,244,354 B2
(45) Date of Patent: Jan. 26, 2016

(54) METHOD FOR PRODUCING THICK FILM PHOTORESIST PATTERN

(71) Applicant: Tokyo Ohka Kogyo Co., Ltd., Kawasaki-shi (JP)

(72) Inventors: Yasushi Washio, Kawasaki (JP); Tomoyuki Ando, Kawasaki (JP); Eiichi Shimura, Kawasaki (JP); Toshiaki Tachi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/708,081

(22) Filed: Dec. 7, 2012

(65) Prior Publication Data
US 2013/0171572 A1    Jul. 4, 2013

(30) Foreign Application Priority Data

Dec. 16, 2011 (JP) ................................. 2011-276382

(51) Int. Cl.
*G03F 7/20* (2006.01)
*G03F 7/004* (2006.01)

(52) U.S. Cl.
CPC ................ *G03F 7/20* (2013.01); *G03F 7/0045* (2013.01); *G03F 7/0048* (2013.01)

(58) Field of Classification Search
CPC ....... G03F 7/0045; G03F 7/0048; G03F 7/20; G03F 7/26
USPC .................................................. 430/322, 325
See application file for complete search history.

(56) References Cited

U.S. PATENT DOCUMENTS

| 8,617,787 | B2 | 12/2013 | Suzuki et al. | |
| 2004/0038148 | A1* | 2/2004 | Ohta et al. | 430/270.1 |
| 2004/0185368 | A1* | 9/2004 | Dammel et al. | 430/191 |
| 2008/0090179 | A1* | 4/2008 | Takeda et al. | 430/286.1 |
| 2011/0300482 | A1 | 12/2011 | Suzuki et al. | |

FOREIGN PATENT DOCUMENTS

| JP | H09-176112 A | 7/1997 |
| JP | H11-052562 A | 2/1999 |
| JP | 2009-265609 A | 11/2009 |
| JP | 2010-185986 A | 8/2010 |
| JP | 2011-215596 A | 10/2011 |
| TW | 201038519 A1 | 11/2010 |
| WO | WO2009/123341 A1 | 10/2009 |

OTHER PUBLICATIONS

Notice of Reasons for Rejection in Japanese Patent Application No. 2011-276382, mailed Apr. 21, 2015.
Notice of Reasons for Rejection in Taiwanese Patent Application No. 101143458, mailed Nov. 20, 2015.

* cited by examiner

*Primary Examiner* — Brittany Raymond
(74) *Attorney, Agent, or Firm* — Knobbe Martens Olson & Bear LLP

(57) ABSTRACT

A method for producing a thick film photoresist pattern including laminating a thick photoresist layer including a chemically amplified positive-type photoresist composition for thick film on a support; irradiating the thick photoresist layer; and developing the thick photoresist layer to obtain a thick film resist pattern; in which the composition includes an acid generator, a resin whose alkali solubility increases by the action of an acid, and an organic solvent having a boiling point of at least 150° C. and a contact angle on a silicon substrate of no greater than 18°, in an amount of at least 40% by mass with respect to total mass of the organic solvent.

5 Claims, No Drawings

METHOD FOR PRODUCING THICK FILM PHOTORESIST PATTERN

This application claims priority under 35 U.S.C. §119(a)-(d) to Japanese Patent Application No. 2011-276382, filed on Dec. 16, 2011, the entire content of which is incorporated herein by reference.

BACKGROUND OF THE INVENTION

1. Field of the Invention

The present invention relates to a method for producing a thick film photoresist pattern.

2. Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, and/or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that connect rewirings extending from peripheral terminals on the wafer with the mounting terminals, are disposed on the surface of the substrate with high precision.

In the photofabrication as described above, a photoresist composition is used, and chemically amplified photoresist compositions containing an acid generator have been known as such a photoresist composition, (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Also, the photoresist compositions used in the photofabrication described above are typically chemically amplified positive-type photoresist compositions for a thick film (see Patent Document 3 and the like). The chemically amplified positive-type photoresist compositions for a thick film are employed for forming bumps or metal posts in plating processes, for example. For example, a thick photoresist layer of about 20 μm is formed on a support, and the photoresist layer is exposed through a predetermined mask pattern and then developed to produce a resist pattern in which portions for forming bumps or metal posts are selectively removed (stripped). Then, bumps or metal posts can be formed by embedding a conductor such as copper into the removed portions (resist-free portions) using plating, and then removing the surrounding residual photoresist pattern.

Patent Document 1: Japanese Unexamined Patent Application, Publication No. H9-176112

Patent Document 2: Japanese Unexamined Patent Application, Publication No. H11-52562

Patent Document 3: Japanese Unexamined Patent Application, Publication No. 2010-185986

SUMMARY OF THE INVENTION

However, the chemically amplified positive-type photoresist composition for thick film as disclosed in Patent Document 3 has been found to have a problem that when the photoresist composition is used to produce a thick film photoresist pattern having a film thickness of no less than 30 μm, the photoresist composition is prone to bubble entrainment (generation of bubbles over a surface of the photoresist layer) during its application or prebaking after the application. Thus, a method for producing a thick film photoresist pattern which enables the suppression of the bubble entrainment over a wide range of film thickness has been sought.

The present invention was made in view of the foregoing problems, and an object of the invention is to provide a method for producing a thick film photoresist pattern while suppressing the bubble entrainment.

The present inventors elaborately pursued research in order to achieve the object described above. Consequently, it was found that the above described problem can be solved by producing a thick film photoresist pattern using a chemically amplified positive-type photoresist composition for thick film containing no less than a specific amount of a specific organic solvent, to accomplish the present invention. Specifically, the present invention provides the following.

The present invention provides a method for producing a thick film photoresist pattern, including: laminating on a support, a thick photoresist layer constituted with a chemically amplified positive-type photoresist composition for thick film; exposing by irradiating the thick photoresist layer with an active ray or radiation; and developing the thick photoresist layer following the exposure to obtain a thick film resist pattern; in which the chemically amplified positive-type photoresist composition for thick film includes an acid generator (A) capable of producing an acid upon irradiation with the active ray or radiation, a resin (B) whose alkali solubility increases by the action of an acid, and an organic solvent (S), and the organic solvent (S) contains an organic solvent having a boiling point of no less than 150° C. at ordinary pressure and a contact angle on a silicon substrate of no greater than 18°, in an amount of no less than 40% by mass with respect to total mass of the organic solvent.

According to the present invention, the bubble entrainment during the production of the thick film photoresist pattern can be suppressed.

DETAILED DESCRIPTION OF THE PREFERRED EMBODIMENTS

The method for producing a thick film photoresist pattern according to the present invention includes: laminating on a support, a thick photoresist layer containing a specific chemically amplified positive-type photoresist composition for thick film; exposing by irradiating the thick photoresist layer with an active ray or radiation; and developing the thick photoresist layer following the exposure to obtain a thick film resist pattern. Hereinafter, the chemically amplified positive-type photoresist composition for thick film used in the present invention (used herein) and each step of the method for producing a thick film photoresist pattern according to the present invention will be described.

(Chemically Amplified Positive-Type Photoresist Composition for Thick Film)

The chemically amplified positive-type photoresist composition for a thick film used herein (hereinafter, may be merely referred to as "photoresist composition") contains at least (A) an acid generator capable of producing an acid upon irradiation with an active ray or radiation, (B) a resin whose alkali solubility increases by the action of an acid, and an organic solvent (S). This photoresist composition is suitably used in manufacture of electronic parts such as circuit substrates and CSPs (chip size packages) packaged in circuit substrates, for producing connection terminals such as bumps and metal posts, or wiring patterns. Each component contained in the photoresist composition used herein is described in detail below.

Acid Generator (A)

The acid generator (A) is a compound which is capable of producing an acid upon irradiation with the active ray or radiation, and is not particularly limited as long as it produces the acid directly or indirectly by the action of light.

Primary examples of the acid generator (A) include compounds represented by the following general formula (a1).

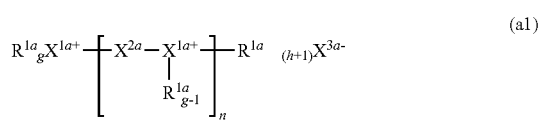
(a1)

In the above general formula (a1), $X^{1a}$ represents a sulfur atom or an iodine atom having a valency of g; and g is 1 or 2. h represents the number of repeating units represented by the structure in the parentheses. $R^{1a}$ represents an organic group attached to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; and $R^{1a}$ may be substituted with at least one selected from the group consisting of an alkyl group, a hydroxy group, an alkoxy group, an alkylcarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, arylsulfonyl, an alkyleneoxy group, an amino group, a cyano group, a nitro group, and a halogen atom. The number of $R^{1a}$ is g+h(g−1)+1, and each $R^{1a}$ may be identical or different from each other. Also, at least two $R^{1a}$ may bond to each other directly or via —O—, —S—, —SO—, —SO$_2$—, —NH—, —NR$^{2a}$—, —CO—, —COO—, —CONH—, an alkylene group having 1 to 3 carbon atoms, or phenylene groups, to form a ring structure containing $X^{1a}$. $R^{2a}$ represents an alkyl group having 1 to 5 carbon atoms or an aryl group having 6 to 10 carbon atoms.

$X^{2a}$ represents a structure represented by the following general formula (a2).

(a2)

In the above general formula (a2), $X^{4a}$ represents an alkylene group having 1 to 8 carbon atoms, an arylene group having 6 to 20 carbon atoms, or a divalent group derived from a heterocyclic compound having 8 to 20 carbon atoms; $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group, and a halogen atom. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure in the parentheses. h+1 $X^{4a}$'s and h $X^{5a}$'s may be each identical or different from each other. $R^{2a}$ is as defined above.

$X^{3a-}$ represents a counterion of the onium, and specific examples thereof include a fluorinated alkyl fluorophosphate anion represented by the following general formula (a17) or a borate anion represented by the following general formula (a18).

(a17)

In the above general formula (a17), $R^{3a}$ represents an alkyl group of which no less than 80% of the hydrogen atoms are substituted with a fluorine atom. j represents the number of $R^{3a}$, and represents an integer of 1 to 5. j $R^{3a}$'s may be identical or different from each other.

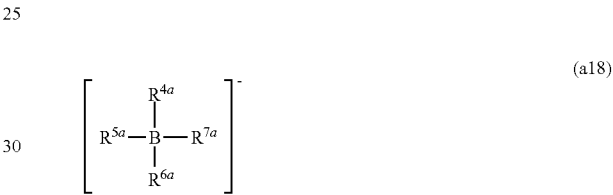
(a18)

In the above general formula (a18), $R^{4a}$ to $R^{7a}$ each independently represent a fluorine atom or a phenyl group, and a part or all hydrogen atoms of the phenyl group may be substituted with at least one selected from the group consisting of a fluorine atom and a trifluoromethyl group.

The onium ion in the compound represented by the above general formula (a1) is exemplified by triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoyl phenylthio)phenyldiphenylsulfonium, diphenylphenacylsulfonium, 4-hydroxyphenyl methylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxy tetradecyloxy)phenylphenyliodonium, 4-isopropylphenyl(p-tolyl)iodonium, or 4-isobutylphenyl(p-tolyl)iodonium, and the like.

Of the examples of the onium ion in the compound represented by the above general formula (a1), preferable onium ions include sulfonium ions represented by the following general formula (a19).

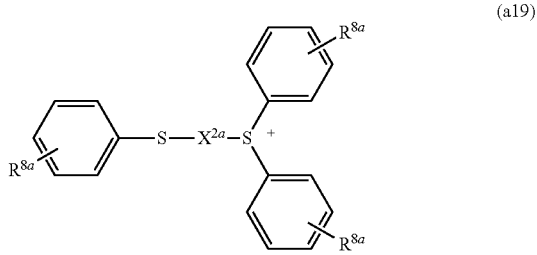

(a19)

In the above general formula (a19), $R^{8a}$ represents each independently a group selected from the group consisting of hydrogen atom, alkyl, hydroxy, alkoxy, alkylcarbonyl, alkylcarbonyloxy, alkyloxycarbonyl, halogen atom, aryl which may have a substituent, arylcarbonyl. $X^{2a}$ represents the same meaning as $X^{2a}$ in the above general formula (a1).

Specific examples of the sulfonium ion represented by the above general formula (a19) include 4-(phenylthio)phenyl-diphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]4-biphenylsulfonium, phenyl[4-(4-biphenylthio)phenyl]3-biphenylsulfonium, and [4-(4-acetophenylthio)phenyl]diphenylsulfonium.

In the fluorinated alkyl fluorophosphate anion represented by the above general formula (a17), $R^{1a}$ represents an alkyl group substituted with a fluorine atom, the preferable carbon number thereof is 1 to 8, and more preferable carbon number is 1 to 4. Specific examples of the alkyl group include a linear alkyl group such as methyl, ethyl, propyl, butyl, pentyl, octyl; a branched alkyl group such as isopropyl, isobutyl, sec-butyl, tert-butyl; as well as a cycloalkyl group such as cyclopropyl, cyclobutyl, cyclopentyl, cyclohexyl; the rate of substitution of the hydrogen atoms of the alkyl group with the fluorine atom is typically no less than 80%, preferably no less than 90%, and more preferably 100%. If the rate of substitution with the fluorine atom is less than 80%, the acid strength of the onium fluorinated alkyl fluorophosphate represented by the above general formula (a1) may be reduced.

Particularly preferable $R^{3a}$ is a linear or branched perfluoroalkyl group having 1 to 4 carbon atoms and the rate of substitution with the fluorine atom of 100%, and specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{3a}$, j, is an integer of 1 to 5, preferably 2 to 4, and particularly preferably 2 or 3.

Specific examples of preferable fluorinated alkyl fluorophosphate anions include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, or $[(CF_3CF_2CF_2)_3PF_3]^-$, and of these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ are particularly preferred.

Specific examples of preferable borate anions represented by the above general formula (a18) include tetrakis(pentafluorophenyl)borate $([B(C_6F_5)_4]^-)$, tetrakis[(trifluoromethyl)phenyl]borate $([B(C_6H_4CF_3)_4]^-)$, difluorobis(pentafluorophenyl)borate $([(C_6F_5)_2BF_2]^-)$, trifluoro(pentafluorophenyl)borate $([(C_6F_5)BF_3]^-)$, tetrakis(difluorophenyl)borate $([B(C_6H_3F_2)_4]^-)$, and the like. Of these, tetrakis(pentafluorophenyl)borate $([B(C_6F_5)_4]^-)$ is particularly preferred.

Secondary examples of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following general formula (a3) such as tris(2,3-dibromopropyl)isocyanurate.

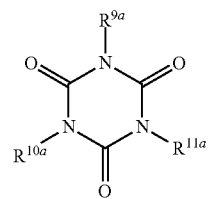

(a3)

In the above general formula (a3), $R^{9a}$, $R^{10a}$ and $R^{11a}$ each independently represent a halogenated alkyl group.

Further, tertiary examples of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following general formula (a4) having an oximesulfonate group.

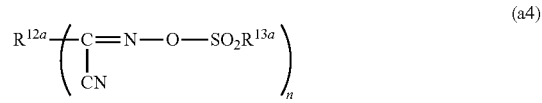

(a4)

In the above general formula (a4), $R^{12a}$ represents a monovalent, bivalent or trivalent organic group; $R^{13a}$ represents a substituted or unsubstituted saturated hydrocarbon group, an unsaturated hydrocarbon group, or an aromatic compound group; and n represents the number of repeating units of the structure in the parentheses.

In the above general formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that $R^{13a}$ is an alkyl group having 1 to 6 carbon atoms such as a methyl group, an ethyl group, a propyl group, and a butyl group. In particular, compounds in which $R^{12a}$ represents an aromatic compound group, and $R^{13a}$ represents an alkyl group having 1 to 4 carbon atoms are preferred.

Examples of the acid generator represented by the above general formula (a4), include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophen-3-ylidene](o-tolyl)acetonitrile and the like. Provided that n is 2, the acid generator represented by the above general formula (a4) is specifically an acid generator represented by the following formulae.

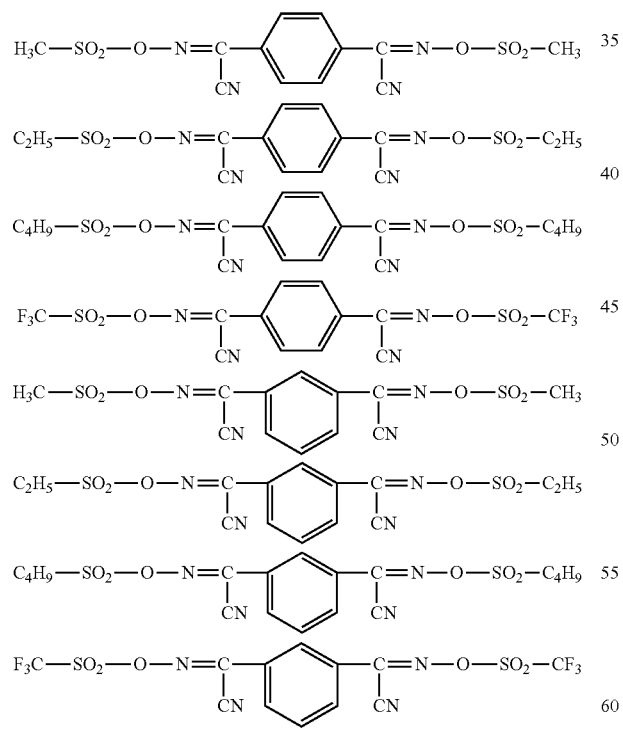

In addition, quaternary examples of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, a linear or branched alkoxy group having 1 to 6 carbon atoms or the like. The structure derived from the naphthalene ring, which may be of a monovalent group (one free valance) or of a bivalent group (two free valences) or of a higher multivalent group, is desirably of a monovalent group (in this regard, the number of free valance is counted except for the portions connecting with the substituents described above). The number of naphthalene rings is preferably 1 to 3.

Preferably, the cation moiety of the onium salt having a naphthalene ring at the cation moiety is of the structure represented by the following general formula (a5).

(a5)

In the above general formula (a5), at least one of $R^{14a}$, $R^{15a}$ and $R^{16a}$ represents a group represented by the following general formula (a6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$ and $R^{16a}$ is a group represented by the following general formula (a6), and the remaining two are each independently a linear or branched alkylene group having 1 to 6 carbon atoms, and these terminals may bond to form a ring structure.

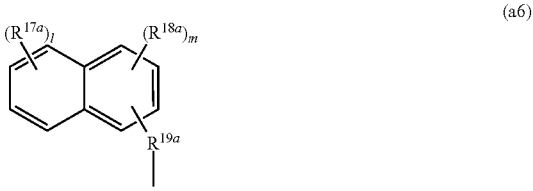

(a6)

In the above general formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms; and $R^{19a}$ represents a single bond or a linear or branched alkylene group having 1 to 6 carbon atoms that may have a substituent. l and m each independently represent an integer of 0 to 2, and l+m is no greater than 3. In this regard, when there exists a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the above general formula (a6) is one in view of the stability of the compound, and the remaining are linear or branched alkylene groups having 1 to 6 carbon atoms of which the terminals may bond to form a ring. In this case, the two alkylene groups described above form a 3 to 9 membered ring including the sulfur atom. Preferably, the number of atoms to form the ring (including the sulfur atom) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 to 6 carbon atoms, linear or branched alkyl groups having 1 to 6 carbon atoms, or the like.

Examples of suitable cation moiety include those represented by the following formulae (a7) and (a8), and the structure represented by the following formula (a8) is particularly preferable.

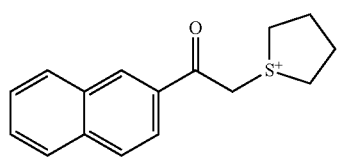

(a7)

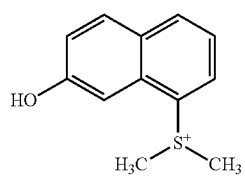

(a8)

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the acid generator is exemplified by fluoroalkylsulfonate ions, of which hydrogen atom(s) being partially or entirely fluorinated, or arylsulfonate ions.

The alkyl group of the fluoroalkylsulfonate ions may be linear, branched or cyclic and have 1 to 20 carbon atoms. Preferably, the carbon number is 1 to 10 in view of bulkiness and diffusion length of the produced acid. In particular, branched or cyclic groups are preferable due to shorter diffusion length. Also, methyl, ethyl, propyl, butyl, octyl groups and the like are preferable due to being inexpensively synthesizable.

The aryl group of the arylsulfonate ions may be an aryl group having 6 to 20 carbon atoms, and is exemplified by a phenol group or a naphthyl group that may be unsubstituted or substituted with an alkyl group or a halogen atom. In particular, aryl groups having 6 to 10 carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonate ion or the aryl sulfonate ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethanesulfonate, perfluorobutanesulfonate, perfluorooctanesulfonate, perfluorobenzenesulfonate, and the like.

Among others, the preferable anion moiety is exemplified by those represented by the following general formula (a9).

$R^{20a}SO_3^-$ (a9)

In the above general formula (a9), $R^{20a}$ represents a group represented by the following general formula (a10) or (a11), or a group represented by the following formula (a12).

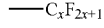

(a10)

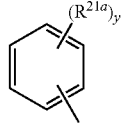

(a11)

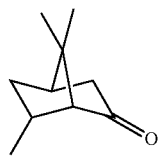

(a12)

In the above general formula (a10), x represents an integer of 1 to 4. Also, in the above general formula (a11), $R^{21a}$ represents a hydrogen atom, a hydroxyl group, a linear or branched alkyl group having 1 to 6 carbon atoms, or a linear or branched alkoxy group having 1 to 6 carbon atoms; and y represents an integer of 1 to 3. Of these, trifluoromethanesulfonate, and perfluorobutanesulfonate are preferable in view of safety.

In addition, a nitrogen-containing moiety represented by the following general formula (a13) or (a14) may be also be used for the anion moiety.

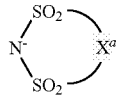

(a13)

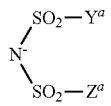

(a14)

In the above general formulae (a13) and (a14), $X^a$ represents a linear or branched alkylene group of which at least one hydrogen atom is substituted with a fluorine atom, the carbon number of the alkylene group is 2 to 6, preferably 3 to 5, and most preferably the carbon number is 3. In addition, $Y^a$ and $Z^a$ each independently represent a linear or branched alkyl group of which at least one hydrogen atom is substituted with a fluorine atom, the carbon number of the alkyl group is 1 to 10, preferably 1 to 7, and more preferably 1 to 3.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted by a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70 to 100% and more preferably 90 to 100%, and most preferable are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) and (a16).

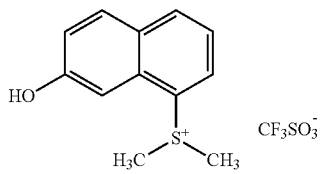

(a15)

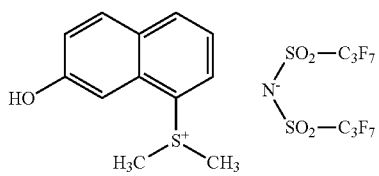

(a16)

Also, quinary examples of the acid generator (A) include bissulfonyldiazomethanes such as bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; ester of trifluoromethanesulfonic acid and N-hydroxyphthalimide or N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

The acid generator (A) may be used alone, or in combinations of two or more thereof. Further, the content of the acid generator (A) is preferably 0.1 to 10% by mass, and more preferably 0.5 to 3% by mass with respect to total mass of the photoresist composition used herein. The above-mentioned range is able to provide sufficient sensitivity, ensures superior solubility in organic solvents to give a homogeneous solution, and improves storage stability.

Resin (B)

The resin (B) whose alkali solubility increases by the action of an acid is not particularly limited, and an arbitrary resin whose alkali solubility increases by the action of an acid may be used. Of these, at least one resin selected from the group consisting of novolak resins (B1), polyhydroxystyrene resins (B2) and acrylic resins (B3) is preferably contained.

Novolak Resin (B1)

As the novolak resin (B1), a resin including the structural unit represented by the following general formula (b1) may be used.

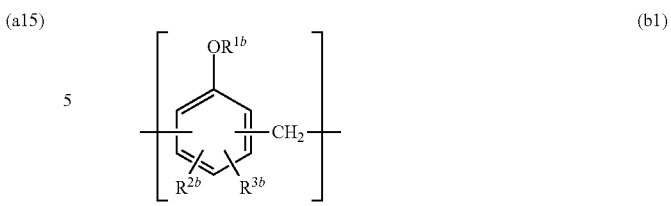

(b1)

In the above general formula (b1), $R^{1b}$ represents an acid-dissociative dissolution-controlling group; $R^{2b}$ and $R^{3b}$ each independently represent a hydrogen atom or an alkyl group having 1 to 6 carbon atoms.

The acid-dissociative dissolution-controlling group represented by the above $R^{1b}$ is preferably a group represented by the following general formula (b2) or (b3), a linear, branched or cyclic alkyl group having 1 to 6 carbon atoms, a vinyloxyethyl group, a tetrahydropyranyl group, a tetrafuranyl group, or a trialkylsilyl group.

(b2)

(b3)

In the above general formulae (b2) and (b3), $R^{4b}$ and $R^{5b}$ each independently represent a hydrogen atom, or a linear or branched alkyl group having 1 to 6 carbon atoms; $R^{6b}$ represents a linear, branched or cyclic alkyl group having 1 to 10 carbon atoms; $R^{7b}$ represents a linear, branched or cyclic alkyl group having 1 to 6 carbon atoms; and o represents 0 or 1.

Examples of the linear or branched alkyl group include a methyl group, an ethyl group, a propyl group, an isopropyl group, a n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociative dissolution-controlling group represented by the above general formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociative dissolution-controlling group represented by the above general formula (b3) include a tert-butoxycarbonyl group, tert-butoxycarbonylmethyl group, and the like. Examples of the trialkylsilyl group include those in which each alkyl group has 1 to 6 carbon atoms, for example, a trimethylsilyl group and tri-tert-butyldimethylsilyl group.

Polyhydroxystyrene Resin (B2)

As the polyhydroxystyrene resin (B2), a resin including the structural unit represented by the following general formula (b4) may be used.

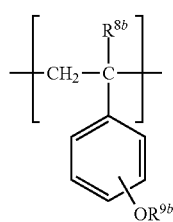

(b4)

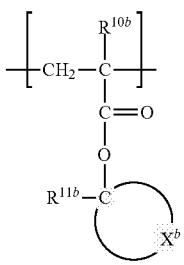

(b5)

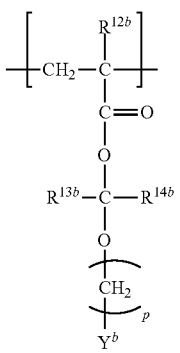

(b6)

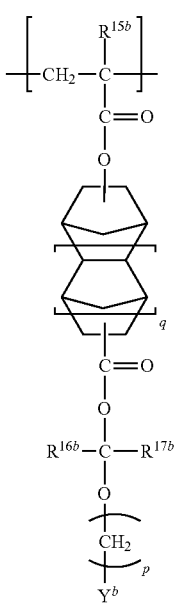

(b7)

In the above general formula (b4), $R^{8b}$ represents a hydrogen atom or an alkyl group having 1 to 6 carbon atoms; and $R^{9b}$ represents an acid-dissociative dissolution-controlling group.

The alkyl group having 1 to 6 carbon atoms may include, for example, linear, branched or cyclic alkyl groups having 1 to 6 carbon atoms. Examples of the linear or branched alkyl group include a methyl group, ethyl group, propyl group, isopropyl group, n-butyl group, isobutyl group, tert-butyl group, pentyl group, isopentyl group and neopentyl group; and examples of the cyclic alkyl group include a cyclopentyl group and cyclohexyl group.

The acid-dissociative dissolution-controlling group represented by the above $R^{9b}$ may be similar to the acid-dissociative dissolution-controlling groups exemplified in terms of the above general formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid; (meth)acrylic acid alkyl esters such as methyl(meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

Acrylic Resin (B3)

As the acrylic resin (B3), a resin including a structural unit represented by the following general formulae (b5) to (b7) may be used.

In the above general formulae (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (in which, $R^{11b}$ is not a hydrogen atom); $X^b$ and the neighboring carbon atoms form a hydrocarbon ring having 5 to 20 carbon atoms; $Y^b$ represents an alicyclic group or alkyl group that may have a substituent; p represents an integer of 0 to 4; and q represents 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms.

Preferably, the aforementioned $R^{11b}$ is a linear or branched alkyl group having 2 to 4 carbon atoms in view of higher contrast, proper resolution, and depth and width of focus, etc.; and preferably, $R^{13b}$, $R^{14b}$, $R^{16b}$, $R^{17b}$ are each a hydrogen atom or a methyl group.

The aforementioned $X^b$ and the neighboring carbon atoms form an alicyclic group having 5 to 20 carbon atoms. Specific examples of the alicyclic group are the groups of monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable are cyclohexane and adamantane from which at least one hydrogen atom is removed (that may further have a substituent).

When the alicyclic group of the abovementioned $X^b$ has a substituent on the ring skeleton, the substituent is exemplified by polar groups such as a hydroxyl group, carboxyl group, cyano group and oxygen atom (=O), and linear or branched lower alkyl groups having 1 to 4 carbon atoms. The polar group is preferably an oxygen atom (=O) in particular.

The aforementioned $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $Y^b$ has a substituent on the ring skeleton, the substituent is exemplified by polar groups such as a hydroxyl group, carboxyl group, cyano group and oxygen atom (=O), and linear or branched lower alkyl groups having 1 to 4 carbon atoms. The polar group is preferably an oxygen atom (=O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above general formula (b5) are those represented by the following formulae (b5-1) to (b5-33).

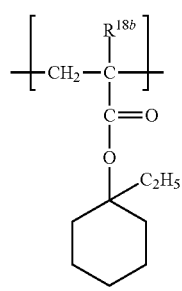
(b5-1)

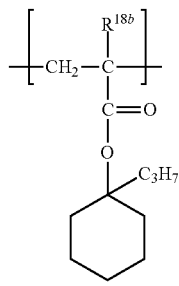
(b5-2)

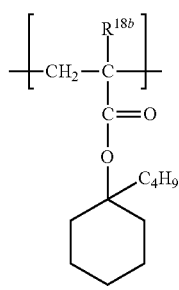
(b5-3)

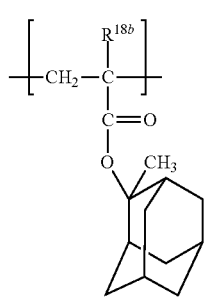
(b5-4)

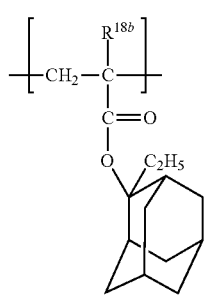
(b5-5)

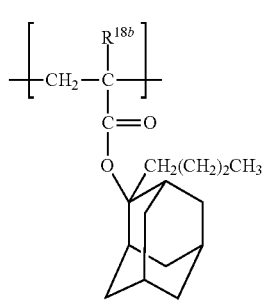
(b5-6)

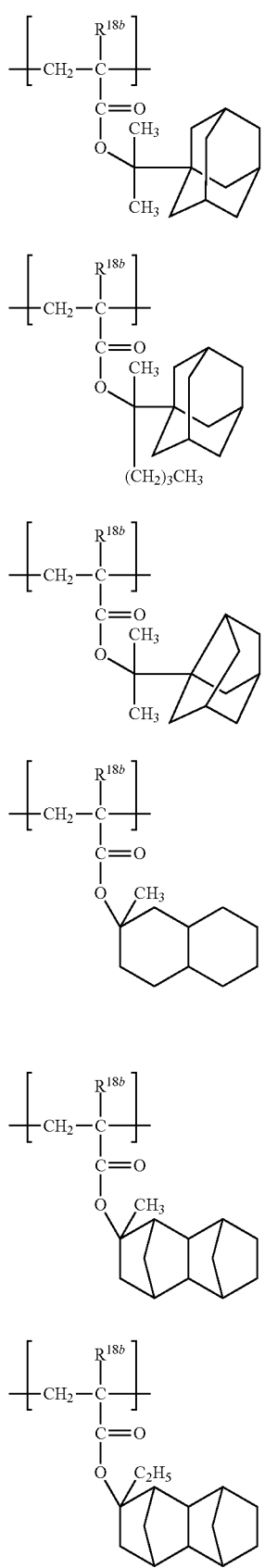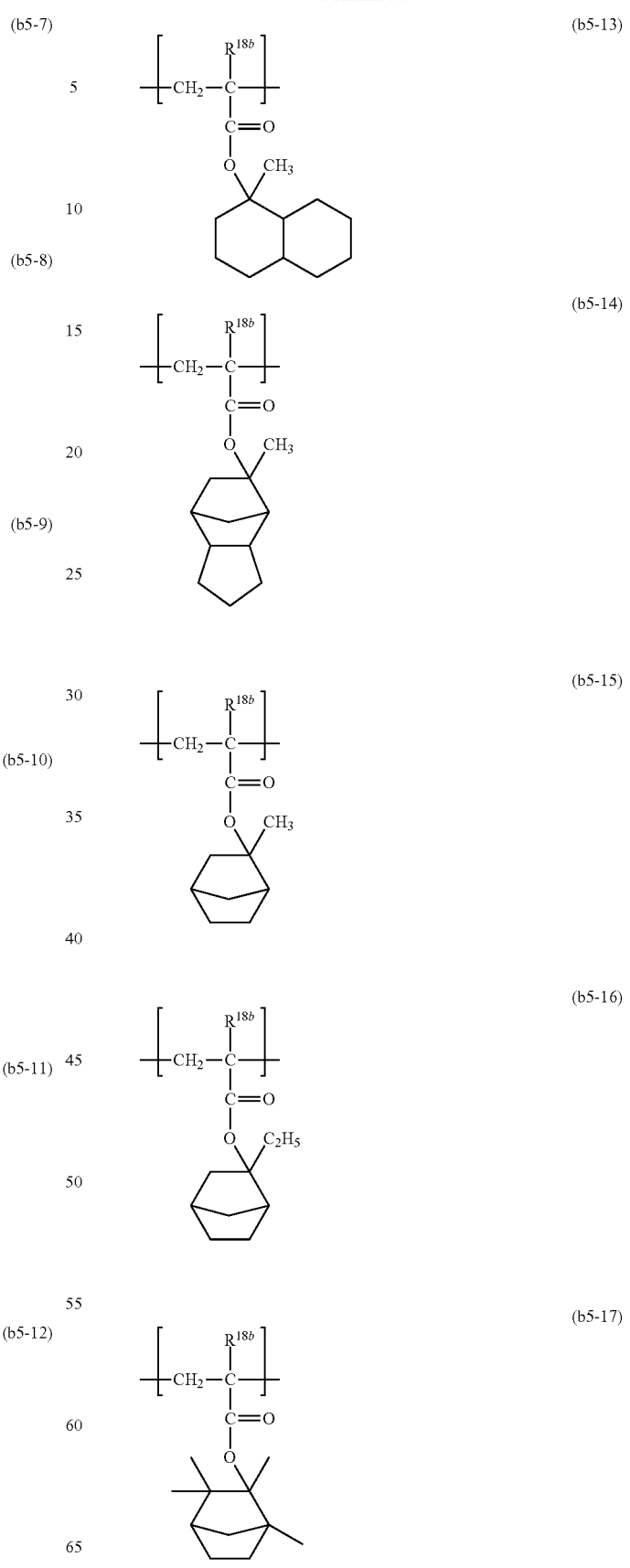

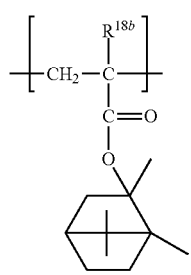
(b5-18)
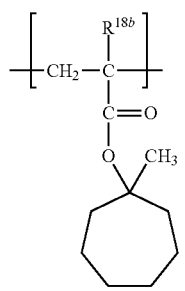
(b5-19)
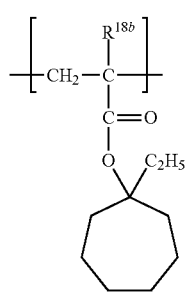
(b5-20)
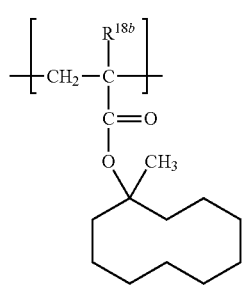
(b5-21)
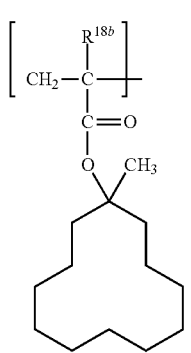
(b5-22)
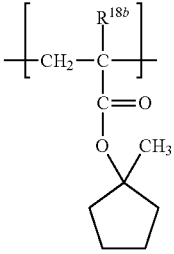
(b5-23)
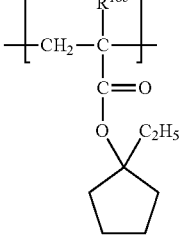
(b5-24)
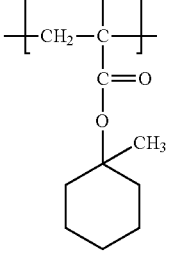
(b5-25)
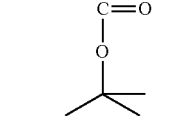
(b5-26)
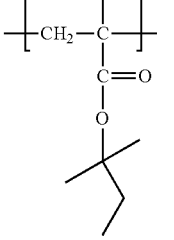
(b5-27)
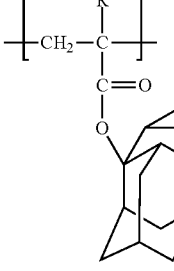
(b5-28)

-continued
(b5-29) 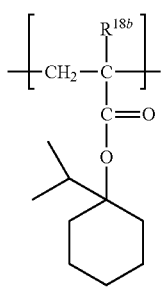
(b5-30) 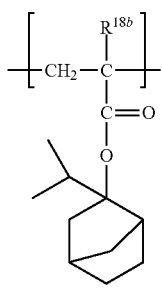
(b5-31) 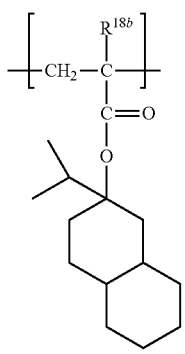
(b5-32) 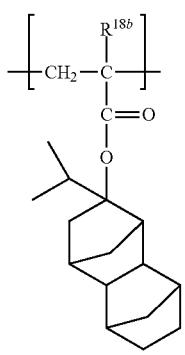
(b5-33) 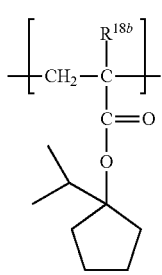
In the above formulae (b5-1) to (b5-33), $R^{18b}$ represents a hydrogen atom or a methyl group.
Preferable specific examples of the structural unit represented by the above general formula (b6) include those represented by the following formulae (b6-1) to (b6-24).
(b6-1) 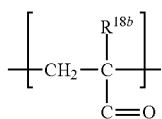
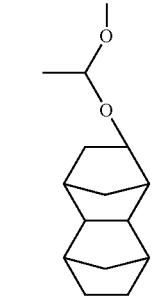
(b6-2) 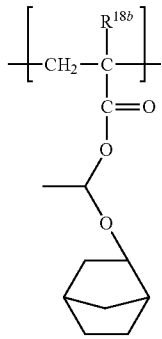
(b6-3) 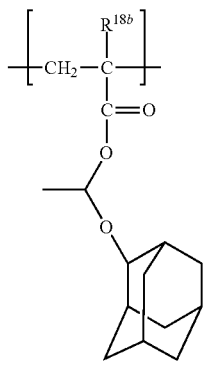
(b6-4) 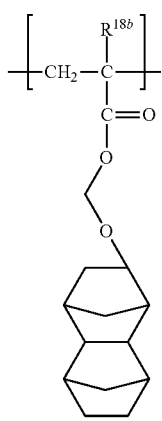

(b6-5)
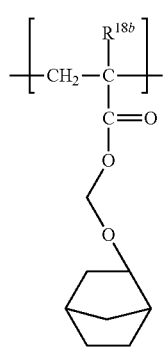
(b6-6)
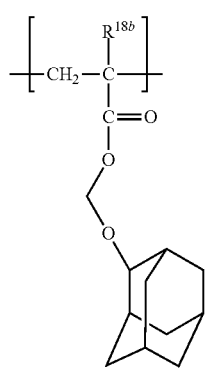
(b6-7)
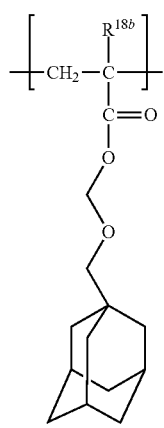
(b6-8)
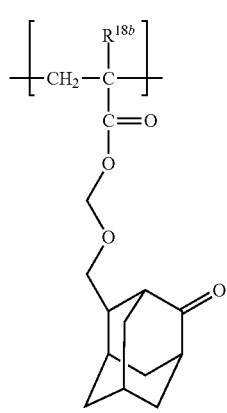
(b6-9)
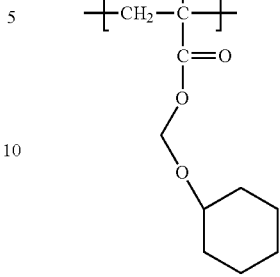
(b6-10)
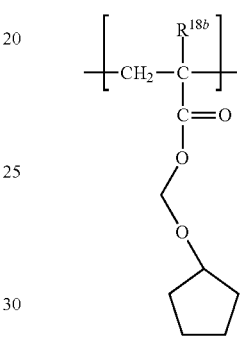
(b6-11)
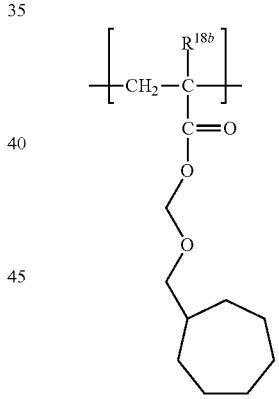
(b6-12)
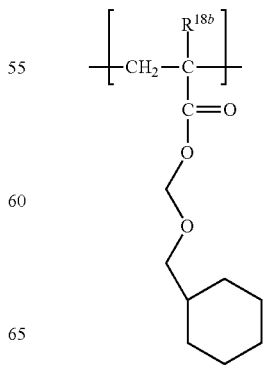

(b6-13)
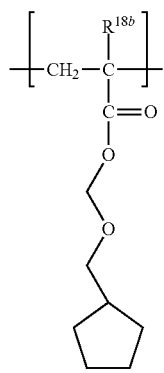
(b6-14)
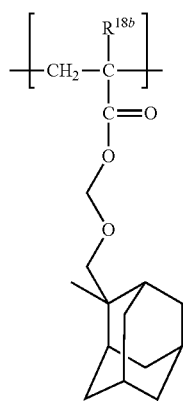
(b6-15)
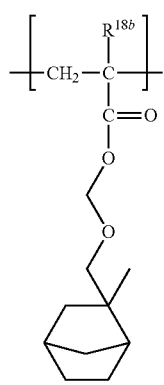
(b6-16)
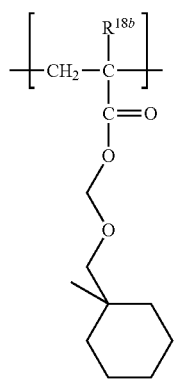
(b6-17)
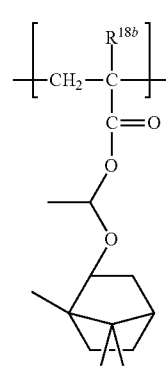
(b6-18)
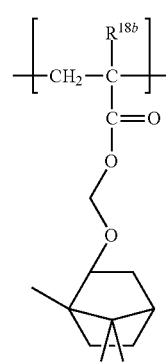
(b6-19)
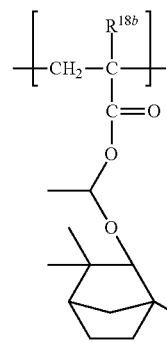
(b6-20)
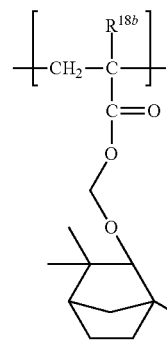

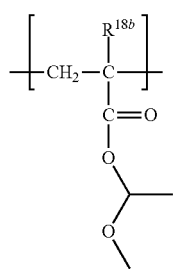 (b6-21)
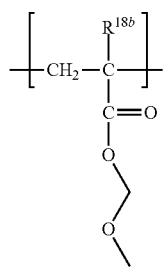 (b6-22)
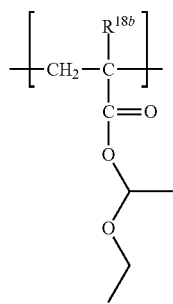 (b6-23)
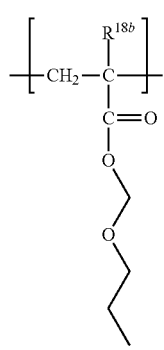 (b6-24)
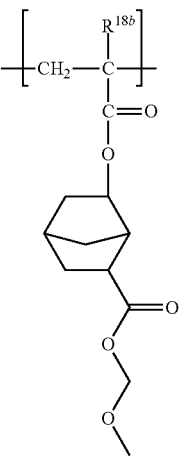 (b7-1)
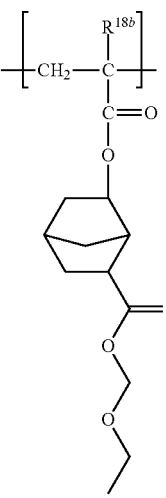 (b7-2)
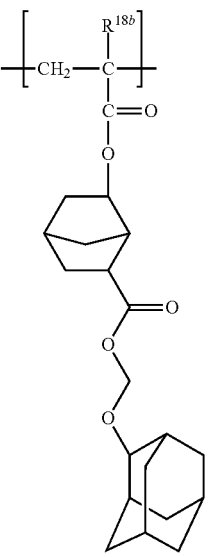 (b7-3)
In the above formulae (b6-1) to (b6-24), $R^{18b}$ represents a hydrogen atom or a methyl group.
Preferable specific examples of the structural unit represented by the above general formula (b7) include those represented by the following formulae (b7-1) to (b7-15).

(b7-4)
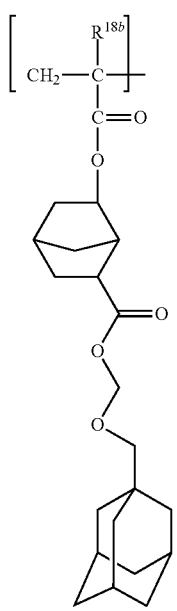
(b7-6)
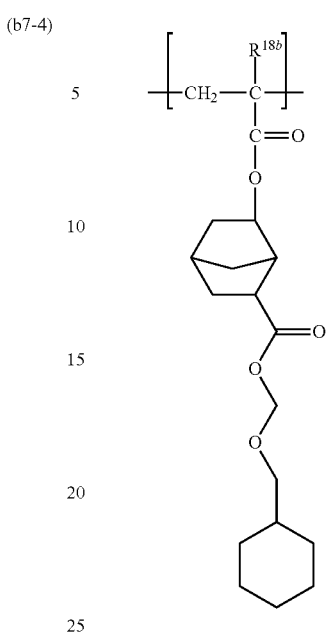
(b7-5)
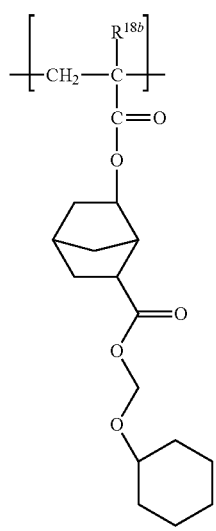
(b7-7)
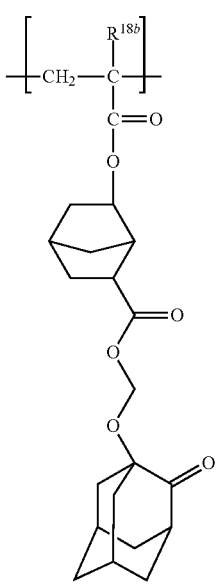

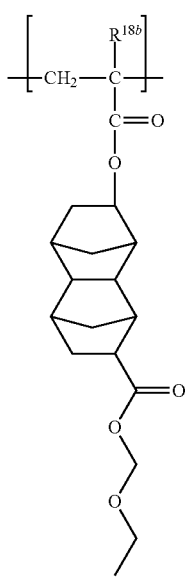
(b7-8)
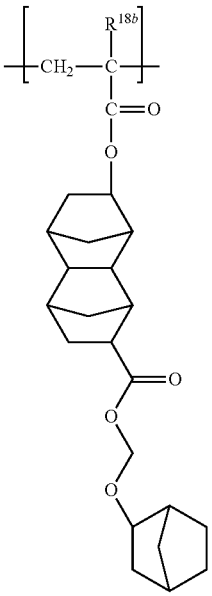
(b7-10)
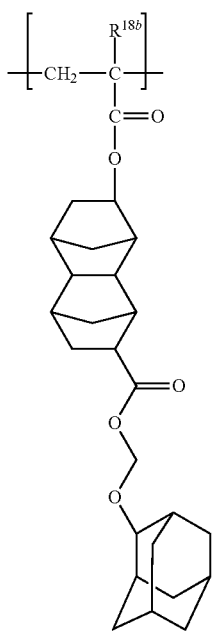
(b7-9)
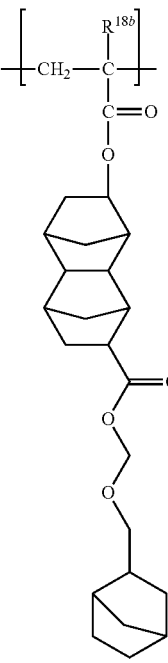
(b7-11)

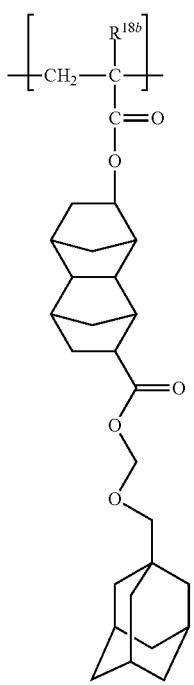
(b7-12)
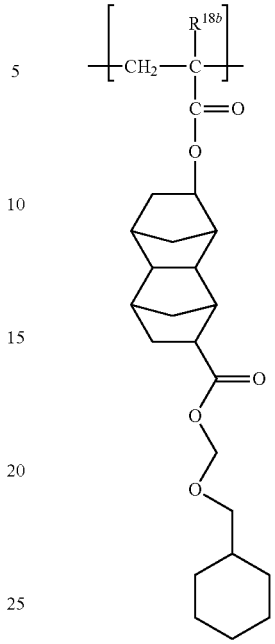
(b7-14)
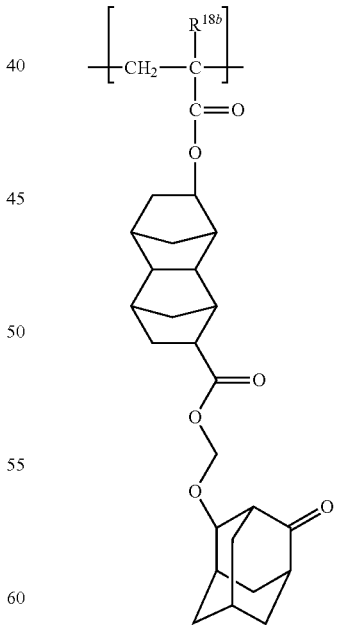
(b7-13)
(b7-15)
In the above formula (b7-1) to (b7-15), $R^{18b}$ represents a hydrogen atom or a methyl group.
It is also preferred that the acrylic resin (B3) includes a copolymer containing a structural unit derived from a polymerizable compound having an ether linkage in addition to the structural unit represented by the above general formulae (b5) to (b7).

Illustrative examples of the polymerizable compound having an ether linkage include radical polymerizable compounds such as (meth)acrylic acid derivatives having an ether linkage and an ester linkage, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the polymerizable compound having an ether linkage is preferably, 2-methoxyethyl (meth)acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl (meth)acrylate, ethyl (meth)acrylate, butyl (meth)acrylate and cyclohexyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Furthermore, examples of the polymerizable compound include (meth)acrylic acid esters having a non-acid-dissociative aliphatic polycyclic group, and vinyl group-containing aromatic compounds, and the like. In particular, preferable non-acid-dissociative aliphatic polycyclic groups include a tricyclodecanyl group, an adamantyl group, a tetracyclododecanyl group, an isobornyl group, a norbornyl group, and the like in view of their industrial availability and the like. The non-acid-dissociative aliphatic polycyclic group may have a linear or branched alkyl group having 1 to 5 carbon atoms as a substituent.

Illustrative examples of the (meth)acrylic acid derivative having a non-acid-dissociative aliphatic polycyclic group include those represented by the following formulae (b8-1) to (b8-5).

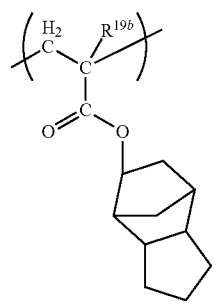

(b8-1)

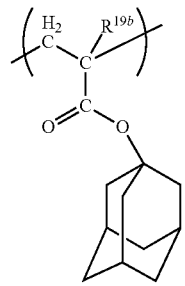

(b8-2)

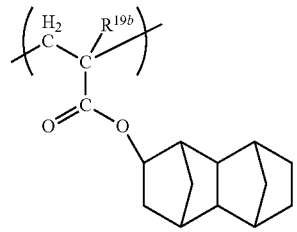

(b8-3)

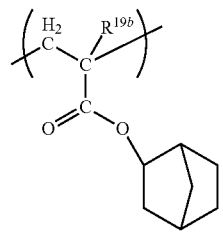

(b8-4)

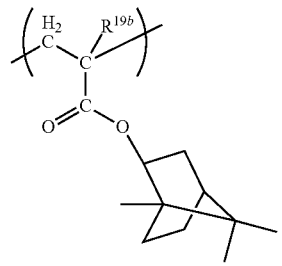

(b8-5)

In the above formulae (b8-1) to (b8-5), $R^{19b}$ represents a hydrogen atom or a methyl group.

Among the above resins (B), the acrylic resin (B3) is preferably used. It is preferred in particular that the acrylic resin (B3) is a copolymer having a structural unit represented by the above general formula (b5), a structural unit derived from a (meth)acrylic acid, a structural unit derived from a (meth)acrylic acid alkyl ester, and a structural unit derived from a (meth)acrylic acid aryl ester.

The copolymer is preferably one represented by the following general formula (b9).

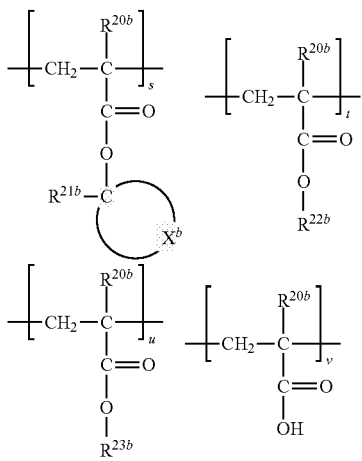

(b9)

In the above general formula (b9), $R^{20b}$ represents a hydrogen atom or a methyl group; $R^{21b}$ represents a linear or branched alkyl group having 2 to 4 carbon atoms; $X^b$ is as defined above; $R^{22b}$ represents a linear or branched alkyl group having 1 to 6 carbon atoms or an alkoxyalkyl group having 1 to 6 carbon atoms; and $R^{23b}$ represents an aryl group having 6 to 12 carbon atoms.

In regard to the copolymers represented by the above general formula (b9), s, t, u and v represent each molar ratio of the structural unit, with s being 8 to 45% by mole, t being 10 to 65% by mole, u being 3 to 25% by mole, and v being 6 to 25% by mole.

The polystyrene equivalent mass average molecular weight of the resin (B) is preferably 10,000 to 600,000, more preferably 20,000 to 400,000, and still more preferably 30,000 to 300,000. By thus adjusting the mass average molecular weight, the thick photoresist layer can maintain sufficient strength without deteriorating peel properties with supports, and also swelling of profiles in plating, and generation of cracks can be prevented.

It is also preferred that the resin (B) has a dispersity of no less than 1.05. Dispersity herein indicates a value of a mass average molecular weight divided by a number average molecular weight. A dispersity in the range described above can avoid problems with respect to stress resistance on intended plating or possible swelling of metal layers resulting from the plating process.

The content of the resin (B) is preferably 5 to 60% by mass with respect to the total mass of the photoresist composition used herein.

Alkali-Soluble Resin (C)

It is preferred that the photoresist composition used herein further contains an alkali-soluble resin (C) in order to improve crack resistance. The alkali-soluble resin as referred to herein may be determined as follows. A solution of the resin to give a resin concentration of 20% by mass (solvent: propylene glycol monomethyl ether acetate) is used to form a resin film having a film thickness of 1 μm on a substrate, and the resin film is immersed in an aqueous 2.38% by mass TMAH solution for 1 min. If the resin was dissolved in an amount of no less than 0.01 μm, the resin is defined to be alkali soluble. The alkali-soluble resin (C) is preferably at least one selected from the group consisting of novolak resins (C1), polyhydroxystyrene resins (C2) and acrylic resins (C3).

Novolak Resin (C1)

The novolak resin (C1) may be prepared, for example, by addition condensation between aromatic compounds having a phenolic hydroxy group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglycinol, hydroxydiphenyl, bisphenol A, gallic acid, gallic acid esters, α-naphthol, β-naphthol, and the like.

Examples of the aldehydes include formaldehyde, furfural, benzaldehyde, nitrobenzaldehyde, acetaldehyde, and the like.

The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxyl group in the resins is substituted with other substituents, or bulky aldehydes are used.

Preferably, the novolak resin (C1) has a mass average molecular weight of 1,000 to 50,000.

Polyhydroxystyrene Resin (C2)

The hydroxystyrene compound to constitute the polyhydroxystyrene resin (C2) is exemplified by p-hydroxystyrene, α-methylhydroxystyrene, α-ethylhydroxystyrene, and the like.

Furthermore, the polyhydroxystyrene resin (C2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

Preferably, the mass average molecular weight of the polyhydroxystyrene resin (C2) is 1,000 to 50,000.

Acrylic Resin (C3)

It is preferred that the acrylic resin (C3) includes a structural unit derived from a polymerizable compound having an ether linkage and a structural unit derived from a polymerizable compound having a carboxyl group.

Illustrative examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether linkage is preferably, 2-methoxyethyl acrylate, and methoxytriethylene glycol acrylate. These polymerizable compounds may be used alone, or in combinations of two or more.

Illustrative examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

Preferably, the mass average molecular weight of the acrylic resin (C3) is 50,000 to 800,000.

The content of the alkali-soluble resin (C) is preferably 0 to 80 parts by mass, and more preferably 0 to 60 parts by mass with respect to 100 parts by mass of total mass of the resin (B) and the resin (C). The content of the alkali-soluble resin (C) as described above tends to be able to improve crack resistance and prevent a decrease in film thickness at development.

Acid Diffusion Control Agent (D)

In order to improve the photoresist pattern configuration, the post exposure stability and the like, it is preferred that the photoresist composition used herein further contains (D) an acid diffusion control agent. The acid diffusion control agent (D) is preferably (D1) a nitrogen-containing compound, and (D2) an organic carboxylic acid, or an oxo acid of phosphorus or a derivative thereof may be further included as needed.

Nitrogen-containing Compound (D1)

Examples of the nitrogen-containing compound (D1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine, and the like. These may be used alone, or in combinations of two or more thereof.

The nitrogen-containing compound (D1) may be used in an amount typically in the range of 0 to 5 parts by mass, and particularly in the range of 0 to 3 parts by mass, with respect to 100 parts by mass of total mass of the resin (B) and the alkali-soluble resin (C).

Organic Carboxylic Acid or Oxo Acid of Phosphorus or Derivative Thereof (D2)

Among the organic carboxylic acid, or the oxo acid of phosphorus or the derivative thereof (D2), specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The organic carboxylic acid, or the oxo acid of phosphorus or the derivative thereof (D2) may be used in an amount typically in the range of 0 to 5 parts by mass, and particularly in the range of 0 to 3 parts by mass, with respect to 100 parts by mass of total mass of the resin (B) and the alkali-soluble resin (C).

Moreover, in order to form a salt to allow for stabilization, the organic carboxylic acid, or the oxo acid of phosphorous or the derivative thereof (D2) is preferably used in an amount equivalent to that of the nitrogen-containing compound (D1).

Organic Solvent (S)

The organic solvent (S) included in the photoresist composition used herein is that which contains an organic solvent having a boiling point of no less than 150° C. at ordinary pressure and a contact angle on a silicon substrate of no greater than 18°, in an amount of no less than 40% by mass with respect to total mass of the organic solvent. The organic solvent having the above-mentioned range of the boiling point allows for the suppression of rapid evaporation during prebaking after the coating, the organic solvent having the above-mentioned range of the contact angle improves wettability on the substrate; thus, when the organic solvent is contained in an amount of no less than 40% by mass with respect to total mass of the organic solvent, bubble entrainment may be suppressed.

The organic solvent which has a boiling point of no less than 150° C. at ordinary pressure and a contact angle on a silicon substrate of no greater than 18° includes 3-methoxybutyl acetate, 2-heptanone, and the like.

The organic solvent (S) included in the photoresist composition used herein may contain other organic solvents than those described above. Specific examples of the other organic solvents include ketones such as acetone, methyl ethyl ketone, cyclohexanone, and methyl isoamyl ketone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate and 3-methyl-3-methoxybutyl acetate; aromatic hydrocarbons such as toluene and xylene; and the like. These may be used alone, or as a mixture of two or more thereof.

The content of the organic solvent (S) can be used without limitation; for example, the organic solvent (S) may be contained in such a range that the solid content of the photoresist composition used herein is 30 to 65% by mass.

Other Components

The photoresist composition used herein may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

In addition, the photoresist composition used herein may further contain an adhesion auxiliary agent for improving adhesive properties with the support.

Also, the photoresist composition used herein may further contain a surfactant for improving coating characteristics, defoaming characteristics, leveling characteristics and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the photoresist composition used herein may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis(anhydrous trimellitate), and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photoresist composition used herein may further contain a sensitizer for improving the sensitivity.
Preparation of Photoresist Composition A method for preparing the photoresist composition used herein may be only mixing and stirring each of the aforementioned components by a conventional method. Each of the aforementioned components may be dispersed and mixed using dispersion equipment such as a dissolver, a homogenizer, or a three-roll mill, if necessary. Thereafter, the mixture may further be filtrated using a mesh, a membrane filter, or the like.
(Lamination Step)

In the method for producing a thick film photoresist pattern according to the present invention, in the lamination step, a thick photoresist layer constituted with the photoresist composition is laminated on a support. The support is not particularly limited, and conventionally well-known one may be used. Illustrative examples of the support include substrates for electronic parts and those on which a predetermined wiring pattern is produced. This substrate includes, for example, a substrate made of metals such as titanium, tantalum, palladium, titanium-tungsten, copper, chrome, iron, aluminum, and the like, and silicon, silicon nitride, and a glass substrate, and the like. As materials for a wiring pattern, copper, solder, chromium, aluminum, nickel, gold, and the like may be used, for example.

The desired coating film is formed by applying a solution of the photoresist composition to the support, and removing the solvent with heating. Spin coating processes, slit coating processes, roll coating processes, screen coating processes, applicator processes, etc. can be employed for the application on the support. The conditions for prebaking the coating film may be varied depending on the type of each component of photoresist composition, their formulation ratio, the thickness of the applied film, and the like, and typically, the prebaking is performed at 70 to 150° C., preferably 80 to 140° C. for about 2 to 60 min.

In the present invention, it is desirable that the film thickness of the thick photoresist layer is in a range of 10 to 150 μm, preferably 20 to 120 μm, and more preferably 20 to 80 μm.
(Exposure Step)

In the method for producing a thick film photoresist pattern according to the present invention, in the exposure step, the thick photoresist layer thus obtained is selectively irradiated (exposed) with an active ray or radiation, for example, visible light or an ultraviolet ray having a wavelength of 300 to 500 nm through a mask having a predetermined pattern.

Low pressure mercury lamps, high pressure mercury lamps, super high pressure mercury lamps, metal halide lamps, argon gas lasers, etc. can be used for the light source of the radiation. The radiation may include microwaves, infrared rays, visible light, ultraviolet rays, X-rays, γ-rays, electron beams, proton beams, neutron beams, ion beams, etc. The irradiation dose of the radiation may vary depending on the constituent of the photoresist composition used herein, the film thickness of the thick photoresist layer, and the like. For example, when an ultra high-pressure mercury lamp is used, the dose may be 100 to 10,000 mJ/cm$^2$. The radiation includes a light ray to activate the acid generator (A) in order to generate an acid.

After the exposure, diffusion of the acid is promoted through heating by conventional processes, followed by changing the alkali solubility of the thick film photoresist layer in this exposed region.
(Development Step)

In the method for producing a thick film photoresist pattern according to the present invention, in the development step, for example, a certain aqueous alkaline solution is used as a developing solution to dissolve and remove unwanted regions, whereby a predetermined thick film photoresist pattern is produced.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photoresist composition used herein, the film thickness of the thick photoresist layer, and the like. Usually, the developing time is 1 to 30 min. The method of the development may be any one of a liquid-filling method, a dipping method, a paddle method, a spray developing method, and the like.

After the development, washing with running water for 30 to 90 seconds is followed by drying with an air gun, drying in an oven, or the like. In this way, the thick film photoresist pattern can be produced.

EXAMPLES

Examples of the present invention are described below; however, the scope of the invention is not intended to be limited by these examples.

Evaluation of Solvent

For the respective organic solvents, 2.5 µL of a droplet was prepared, the droplet was contacted with a silicon substrate, a contact angle immediately after the contact was measured three times using a FACE contact angle meter (Kyowa Interface Science; model CA-X150), and the average value of the measurements was calculated. The contact angle and the boiling point at atmospheric pressure are shown in Table 1.

TABLE 1

| organic solvent | boiling point (° C.) | contact angle (°) |
| --- | --- | --- |
| MA | 172 | 15.3 |
| HP | 150 | 12.9 |
| PGMEA | 146 | 18.4 |
| PGME | 119 | 20.0 |
| EL | 154 | 20.6 |
| CH | 156 | 20.5 |
| BA | 126 | 14.1 |

MA: 3-methoxybutyl acetate
HP: 2-heptanone
PGMEA: propylene glycol monomethyl ether acetate
PGME: propylene glycol monomethyl ether
EL: ethyl lactate
CH: cyclohexanone
BA: butyl acetate Of the organic solvents shown in Table 1, MA and HP fall under the organic solvent having a boiling point of no less than 150° C. at atmospheric pressure and a contact angle on a silicon substrate of no greater than 18°.

Preparation of Photoresist Composition

Each component shown in Table 2 was uniformly dissolved in the organic solvent, to prepare a photoresist composition having solid content of 48% by mass. The photoresist composition was filtered through a membrane filter having a pore size of 1 µm, and then was used for the evaluation of the bubble entrainment. Numerical values in parentheses in the Table 2 represent parts by mass of the respective components.

TABLE 2

| | Acid generator (A) | Resin (B) | Alkali-soluble resin (C) | Organic solvent (S) | Acid diffusion control agent (D) |
| --- | --- | --- | --- | --- | --- |
| Example 1 | ZA-1 (2.0) | ZB-1 (50) | ZC-1 (50) | MA (100) | TPA (0.1) |
| Example 2 | ZA-1 (2.0) | ZB-1 (50) | ZC-1 (50) | HP (100) | TPA (0.1) |
| Example 3 | ZA-1 (2.0) | ZB-1 (50) | ZC-1 (50) | PGMEA/MA (60/40) | TPA (0.1) |
| Example 4 | ZA-1 (2.0) | ZB-1 (50) | ZC-1 (50) | PGMEA/MA (40/60) | TPA (0.1) |
| Example 5 | ZA-1 (2.0) | ZB-1 (50) | ZC-1 (50) | PGMEA/MA (20/80) | TPA (0.1) |
| Example 6 | ZA-1 (2.0) | ZB-2 (100) | 0 | PGMEA/MA (40/60) | TPA (0.1) |
| Example 7 | ZA-1 (2.0) | ZB-3 (40) | ZC-1/ZC-2 (50/10) | PGMEA/MA (40/60) | TPA (0.1) |
| Example 8 | ZA-1 (2.0) | ZB-4 (70) | ZC-2 (30) | PGMEA/MA (40/60) | TPA (0.1) |
| Comparative Example 1 | ZA-1 (2.0) | ZB-1 (50) | ZC-1 (50) | PGMEA (100) | TPA (0.1) |
| Comparative Example 2 | ZA-1 (2.0) | ZB-1 (50) | ZC-1 (50) | PGME (100) | TPA (0.1) |
| Comparative Example 3 | ZA-1 (2.0) | ZB-1 (50) | ZC-1 (50) | EL (100) | TPA (0.1) |
| Comparative Example 4 | ZA-1 (2.0) | ZB-1 (50) | ZC-1 (50) | CH (100) | TPA (0.1) |
| Comparative Example 5 | ZA-1 (2.0) | ZB-1 (50) | ZC-1 (50) | BA (100) | TPA (0.1) |
| Comparative Example 6 | ZA-1 (2.0) | ZB-1 (50) | ZC-1 (50) | PGMEA/MA (80/20) | TPA (0.1) |

ZA-1: compound represented by the following formula

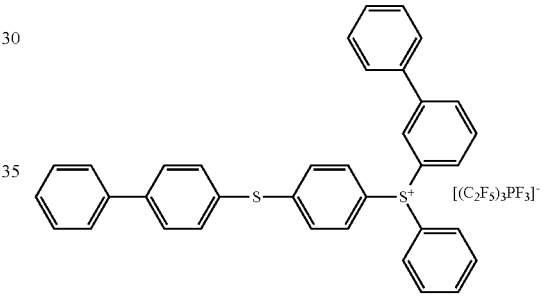

ZB-1: acrylic resin represented by the following formula (mass average molecular weight: 40,000, dispersity: 1.8)

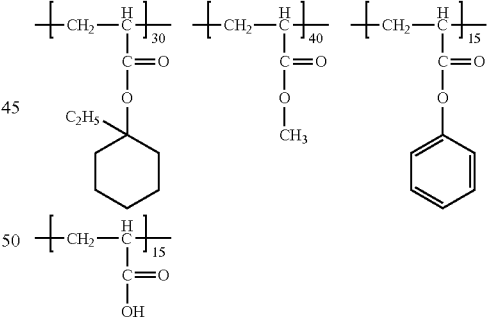

ZB-2: acrylic resin (acrylic acid unit:methoxy polyethylene glycol acrylate unit:methyladamantyl acrylate unit = 10:30:60 (in molar ratio); molecular weight: 50,000)
ZB-3: acrylic resin (acrylic acid unit:methyl acrylate unit:methoxy triethyleneglycol acrylate unit:cyclohexyl acrylate unit:ethylcyclohexyl acrylate = 10:10:10:30:40 (in molar ratio); molecular weight: 200,000)
ZB-4: novolak resin (a resin obtained by protecting, with ethyl vinyl ether, 10% of the hydroxyl groups of a novolak resin prepared by addition condensation of m/p-cresol (6/4) and formaldehyde in the presence of an acid catalyst; molecular weight: 20,000)
ZC-1: novolak resin (prepared by addition condensation of m/p-cresol (6/4) and formaldehyde in the presence of an acid catalyst; molecular weight: 8000)
ZC-2: polyhydroxystyrene resin (VP-2500: manufactured by Nippon Soda Co., Ltd., molecular weight: 3000)
TPA: tri-n-pentylamine Evaluation of Bubble Entrainment The photoresist compositions shown in Table 2 were applied on an 8-inch silicon substrate (provided with scrub lines at 2 cm intervals in a grid pattern; 80 µm depth) with a spin coater, to obtain a thick photoresist layer having a film thickness of 50 µm. Then, the thick photoresist layer was prebaked at 140° C. for 5 min. After the prebaking, the number of bubbles generated throughout the photoresist film surfaces and having a diameter of no less than 100 μm was visually counted. The results are shown in Table 3.

TABLE 3

|  | Number of bubbles |
|---|---|
| Example 1 | 30 |
| Example 2 | 42 |
| Example 3 | 60 |
| Example 4 | 55 |
| Example 5 | 42 |
| Example 6 | 49 |
| Example 7 | 55 |
| Example 8 | 59 |
| Comparative Example 1 | 180 |
| Comparative Example 2 | 174 |
| Comparative Example 3 | 116 |
| Comparative Example 4 | 144 |
| Comparative Example 5 | 136 |
| Comparative Example 6 | 88 |

As is seen from Table 3, when the photoresist composition containing MA or HP, as the organic solvent having a boiling point of no less than 150° C. at ordinary pressure and a contact angle on a silicon substrate of no greater than 18°, in an amount of no less than 40% by mass with respect to total mass of the solvent was employed, the bubble generation was able to be remarkably suppressed.

What is claimed is:
1. A method for producing a thick film photoresist pattern, comprising:
  laminating a thick photoresist layer comprising a chemically amplified positive-type photoresist composition for thick film on a support;
  irradiating the thick photoresist layer with an active ray or radiation; and
  developing the thick photoresist layer following the irradiating to obtain a thick film resist pattern;
  wherein:
    the chemically amplified positive-type photoresist composition for thick film comprises an acid generator (A) capable of producing an acid upon irradiation with the active ray or radiation, a resin (B) whose alkali solubility increases by the action of an acid, and an organic solvent (S);
    wherein the acid generator (A) is a compound represented by the following general formula (a1), a halogen-containing triazine compound, a compound represented by the following general formula (a4) or a compound composed of a cation moiety represented by the following general formula (a5) and an anion moiety represented by the following general formula (a9), (a13) or (a14);

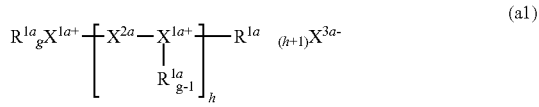

(a1)

in the above general formula (a1), $X^{1a}$ represents a sulfur atom or an iodine atom having a valency of g; g is 1 or 2; h represents the number of repeating units represented by the structure in the parentheses; $R^{1a}$ represents an organic group attached to $X^{1a}$ and represents an aryl group having 6 to 30 carbon atoms, a heterocyclic group having 4 to 30 carbon atoms, an alkyl group having 1 to 30 carbon atoms, an alkenyl group having 2 to 30 carbon atoms or an n 1 group having 2 to 30 carbon atoms; $R^{1a}$ may be substituted with at least one selected from the group consisting of an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, arylsulfonyl, an alkyleneoxy group, an amino group, a cyano group, a nitro group and a halogen atom; the number of $R^{1a}$ is g+h(g−1)+1, each $R^{1a}$ may be identical or different from each other; also, at least two $R^{1a}$ may bond to each other directly or via —O—, —S—, —SO—, —SO$_2$—, —NH—, —NR$^{2a}$—, —CO—, —COO—, —CONH—, an alkylene group having 1 to 3 carbon atoms, or phenylene groups, to form a ring structure containing $X^{1a}$; and $R^{2a}$ represents an alkyl group having 1 to 5 carbon atoms or an aryl group having 6 to 10 carbon atoms;

in the above general formula (a1), $X^{2a}$ represents a structure represented by the following general formula (a2);

(a2)

in the above general formula (a2), $X^{4a}$ represents an alkylene group having 1 to 8 carbon atoms, an arylene group having 6 to 20 carbon atoms or a divalent group derived from a heterocyclic compound having 8 to 20 carbon atoms; $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxy group, a cyano group, a nitro group and a halogen atom; $X^{5a}$ represents —O—, —S—, —SO—, —SO$_2$—, —NH—, —NR$^{2a}$—, —CO—, —COO—, —CONH—, an alkylene group having 1 to 3 carbon atoms or a phenylene group; h represents the number of repeating units of the structure in the parentheses; h+1 $X^{4a}$'s and h $X^{5a}$'s may be each identical or different from each other, and $R^{2a}$ represents an alkyl group having 1 to 5 carbon atoms or an aryl group having 6 to 10 carbon atoms;

in the above general formula (a1), $X^{3a-}$ represents a counterion of the onium, and is a fluorinated alkyl fluorophosphate anion represented by the following general formula (a17) or a borate anion represented by the following general formula (a18);

(a17)

in the above general formula (a17), $R^{3a}$ represents an alkyl group of which no less than 80% of the hydrogen atoms are substituted with a fluorine atom; j represents an integer of 1 to 5; and j $R^{3a}$'s ma be identical or different from each other;

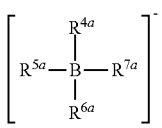
(a18)

in the above general formula (a18), $R^{4a}$ to $R^{7a}$ each independently represent a fluorine atom or a phenyl group, and a part or all hydrogen atoms of the phenyl group may be substituted with at least one selected from the group consisting of a fluorine atom and a trifluoromethyl group;

the halogen-containing triazine compound is selected from the group consisting of 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine, and compounds represented by the following general formula (a3)

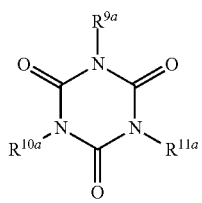
(a3)

in the above general formula (a3), $R^{9a}$, $R^{10a}$ and $R^{11a}$ each independently represent a halogenated alkyl group;

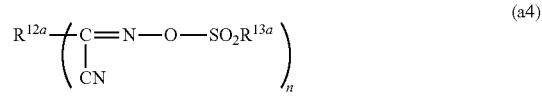
(a4)

in the above general formula (a4), $R^{12a}$ represents a monovalent, bivalent or trivalent organic group; $R^{13a}$ represents a substituted or unsubstituted saturated hydrocarbon group, an unsaturated hydrocarbon group, or an aromatic compound group; and n represents the number of repeating units of the structure in the parentheses;

(a5)

in the above general formula (a5), at least one of $R^{14a}$, $R^{15a}$ and $R^{16a}$ represents a group represented by the following general formula (a6); the remaining represents a linear or branched alkyl group having 1 to 6 carbon atoms, a phenyl group which may have a substituent, a hydroxyl group, or a linear or branched alkoxy group having 1 to 6 carbon atoms; alternatively, one of $R^{14a}$, $R^{15a}$ and $R^{16a}$ is a group represented by the following general formula (a6); the remaining two are each independently a linear or branched alkylene group having 1 to 6 carbon atoms; and these terminals may bond to form a ring structure;

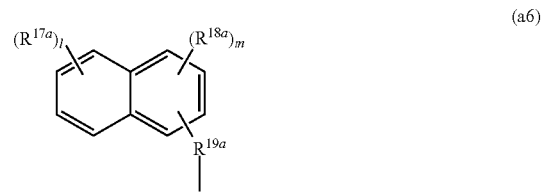
(a6)

in the above general formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms; and $R^{19a}$ represents a single bond or a linear or branched alkylene group having 1 to 6 carbon atoms that may have a substituent; and l and m each independently represent an integer of 0 to 2, and l+m is no greater than 3; provided that, when there exists a plurality of $R^{17a}$, the may be identical plurality or different from each other and when there exist a plurality of $R^{18a}$, they may be identical or different from each other;

(a9)

in the above general formula (a9), $R^{20a}$ represents a group represented by the following general formula (a10) or (a11), or a group represented by the following formula (a12);

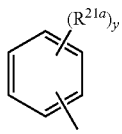 (a10)

 (a11)

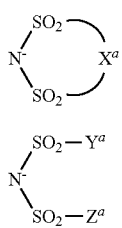 (a12)

in the above general formula (a10), x represents an integer of 1 to 4; in the above general formula (a11), $R^{21a}$ represents a hydrogen atom, a hydroxyl group, a linear or branched alkyl group having 1 to 6 carbon atoms, or a linear or branched alkoxy group having 1 to 6 carbon atoms; and y represents an integer of 1 to 3;

(a13)
(a14)

in the above general formulae (a13) and (a14), $X^a$ represents a linear or branched alkylene group of which at least one hydrogen atom is substituted with a fluorine atom; $Y^a$ and $Z^a$ each independently represent a linear or branched alkyl group of which at least one hydrogen atom is substituted with a fluorine atom;

the resin (B) is a novolak resin including the structural unit represented by the following general formula (b1), a polyhydroxystyrene resin including the structural unit represented by the following general formula (b4) or an acrylic resin including a structural unit represented by the following general formula (b5) or (b6);

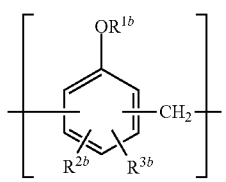 (b1)

in the above general formula (b1), $R^{1b}$ represents an acid-dissociative dissolution-controlling group; $R^{2b}$ and $R^{3b}$ each independently represent a hydrogen atom or an alkyl group having 1 to 6 carbon atoms;

the acid-dissociative dissolution-controlling group represented by the above $R^{1b}$ is a group represented by the following general formula (b2) or (b3), a linear, branched or cyclic alkyl group having 1 to 6 carbon atoms, a vinyloxyethyl group, a tetrahydropyranyl group, a tetrafuranyl group or a trialkylsilyl group;

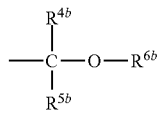 (b2)

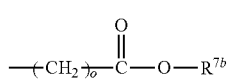 (b3)

in the above general formulae (b2) and (b3), $R^{4b}$ and $R^{5b}$ each independently represent a hydrogen atom, or a linear or branched alkyl group having 1 to 6 carbon atoms; $R^{6b}$ represents a linear, branched or cyclic alkyl group having 1 to 10 carbon atoms; $R^{7b}$ represents a linear, branched or cyclic alkyl group having 1 to 6 carbon atoms; and o represents 0 or 1;

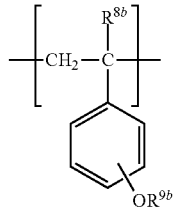 (b4)

in the above general formula (b4), $R^{8b}$ represents a hydrogen atom or an alkyl group having 1 to 6 carbon atoms; and $R^{9b}$ represents an acid-dissociative dissolution-controlling group;

the acid-dissociative dissolution-controlling group represented by the above $R^{9b}$ is a group represented by the above general formula (b2) or (b3); and

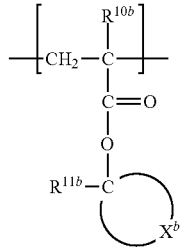 (b5)

-continued (b6)

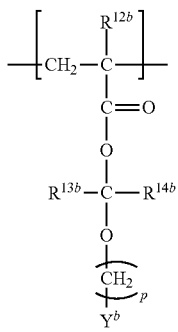

in the above general formulae (b5) and (b6), $R^{10b}$ to $R^{14b}$ each independently represent a hydrogen atom, a linear or branched alkyl group having 1 to 6 carbon atoms, a fluorine atom, or a linear or branched fluorinated alkyl group having 1 to 6 carbon atoms (in which, $R^{11b}$ is not a hydrogen atom); $X^b$ and the neighboring carbon atoms form a hydrocarbon ring having 5 to 20 carbon atoms; $Y^b$ represents an alicyclic group or alkyl group that may have a substituent; and p represents an integer of 0 to 4; and the organic solvent (S) comprises 3-methoxybutyl acetate, in an amount of no less than 40% by mass with respect to total mass of the organic solvent.

2. The method for producing a thick film photoresist pattern according to claim 1, wherein the chemically amplified positive-type photoresist composition for thick film further comprises an alkali-soluble resin (C).

3. The method for producing a thick film photoresist pattern according to claim 2, wherein the alkali-soluble resin (C) comprises at least one resin selected from the group consisting of a novolak resin (C1), a polyhydroxystyrene resin (C2) and an acrylic resin (C3).

4. The method for producing a thick film photoresist pattern according to claim 1, wherein the chemically amplified positive-type photoresist composition for thick film further comprises an acid diffusion control agent (D).

5. The method for producing a thick film photoresist pattern according to claim 1, wherein the film thickness of the thick photoresist layer after coating the photoresist composition thereon is in a range of 10 to 150 µm.

\* \* \* \* \*